United States Patent [19]
Mearini et al.

[11] Patent Number: 5,944,573
[45] Date of Patent: Aug. 31, 1999

[54] METHOD FOR MANUFACTURE OF FIELD EMISSION ARRAY

[75] Inventors: Gerald T. Mearini, Richmond Heights; Robert E. Kusner, Solon, both of Ohio

[73] Assignee: BAV Technologies, Ltd., Cleveland, Ohio

[21] Appl. No.: 08/988,046

[22] Filed: Dec. 10, 1997

[51] Int. Cl.[6] .................................................. H01J 9/02
[52] U.S. Cl. ................................................. 445/50; 445/24
[58] Field of Search ............................. 445/24, 50

[56] References Cited

U.S. PATENT DOCUMENTS

| | | | |
|---|---|---|---|
| 5,141,460 | 8/1992 | Jaskie et al. | 445/50 |
| 5,836,796 | 11/1998 | Danroe | 445/24 |

OTHER PUBLICATIONS

D. Hong, et al., "Field emission from p–type polycrystalline diamond films," *JVSTB*, (1995) pp. 427–430.

J. Lui, et al., "Field emission characteristics of diamond coated silicon field emitters," *JVSTB*, (1995) pp. 422–426.

K. Derbyshire, "Beyond AMLCDs: Field emission displays?" *Solid State Technology*, (Nov. 1994) pp. 55–65.

E.I. Givargizov, "Silicon tips with diamond particles on them: New field emitters?" *JVSTB*, (1995) pp. 414–417.

E.I. Givargizov, "Microstructure and field emission of diamond particles on silicon tips," *Applied Surface Science*, (1995) pp. 24–30.

C.A. Spindt, "Field–Emitter Arrays for Vacuum Microelectronics," *IEEE Transactions on Electron Devices*, vol. 38, No. 10, (Oct. 1991) pp. 2355–2363.

G.S. Yang, et al., "Effect of ultrahigh nucleation density on diamond growth at different growth rates and temperatures," *JVSTB*, (1995) pp. 1030–1–36.

H. Kawarada, et al., "Heteroepitaxial growth of smooth and continous diamond thin films on silicon substrates via high quality silicon carbide buffer layers," *Appl. Phys. Lett.*, 66 (5), (Jan. 1995) pp. 583–585.

S. Mirzakuchaki, et al., "Selective area deposition of diamond thin films on patterns of porous silicon by hot–filament chemical vapor deposition," *Appl. Phys. Lett.*, 67 (24), (Dec. 1995) pp. 3557–3559.

S. Iannazzo, "A survey of the present status of vacuum micorelectronics," *Solid State Electronics*, vol. 36, No. 3, (1993) pp. 301–320.

*Primary Examiner*—Kenneth J. Ramsey
*Attorney, Agent, or Firm*—Fay, Sharpe, Beall, Fagan, Minnich & McKee, LLP

[57] ABSTRACT

A process for depositing diamond crystals onto a field emission cathode. The process involves providing a cathode having a substrate, a gate layer and a plurality of emitters electrically insulated from the gate layer. An electric bias is applied to the gate layer and a ground potential is applied to the emitters. A heat source is positioned adjacent the cathode, and the cathode is exposed to a field of ions for a sufficient period to at least partially clean the emitters. A carbon containing gas is added to the atmosphere adjacent to the cathode such that carbon ions are dissociated from the gas and deposited on the emitters to form a "soot". The temperature of the cathode is then adjusted to a level which allows formation of diamond film.

16 Claims, 2 Drawing Sheets

TOP VIEW

SIDE VIEW

METHOD FOR MANUFACTURE OF FIELD EMISSION ARRAY

BACKGROUND OF THE INVENTION

This invention relates to a method of manufacturing micro-electronic devices including a selectively positioned diamond film. More particularly, this invention is directed to the manufacture of an emission array having a diamond film deposited onto the field emission tips.

The method of the invention is particularly well suited to be used in the manufacture of a Spindt-type cathode including a diamond film on the field emission tips for use in field emission displays. Throughout the specification, numerous references will be made to the use of the inventive method in the manufacture of Spindt-type field emission arrays, however, it should be realized that the inventive method could be used in any instance wherein a diamond film is being deposited on a micro-electronic device.

A reason for the focus on field emission displays is provided by an article by Katherine Derbyshire entitled "Beyond AMLCDs: Field Emission Displays", appearing in *Solid State Technology*, 37 (11) November, 1994, wherein the author states that the flat panel display market is growing even more rapidly than display makers have expected. It is stated that in the not too distant future, personal digital assistants, virtual reality driven robotics, global positioning systems, and many other civil and military applications will depend on portable, efficient, high-performance displays to communicate with users. Field emission displays are believed to represent one mechanism with which to achieve such advances.

Furthermore, televisions and cathode ray tubes (CRTs) presently utilize a thermionic cathode to produce a primary electron beam directed onto a phosphorous screen to create an image. These cathodes produce electrons when heated sufficiently for thermionic emission and an image is produced by rastering the electron beam across the view screen. Larger screen diameters require a larger cathode-to-screen distance to enable the electron beam to cover the entire screen, which results in a very cumbersome package, reduced beam density and ultimately a darker display. In addition, thermionic cathode technology is rapidly approaching the brightness limit due to the physical properties in the materials used. Therefore, the increased commercial and military demand for higher resolution and larger viewing area televisions and data collection monitors cannot be met with current display technology.

However, field emission cold cathodes which operate on the principle of electron emission due to a high applied electric field at the emitter tip, may offer a solution to the above-described commercial demand. In fact, early microfield emission devices were produced by Spindt in 1968. The shortfalls of a Spindt-type cathode are low output intensity and relatively high applied electric field corresponding to high voltage required for electron emission.

It has been recognized that diamond provides unique properties to a field emission display. Particularly, diamond film has been observed to produce stable electron emission at relatively low applied fields. Also, diamond is a robust material well known for its high chemical and temperature resistance. In fact, field emitters coated with polycrystalline diamond have demonstrated very high emission currents, a low effective work function, a large effective emission rate and high current stability. For example, in an article entitled "Microstructure and Field Emission of Diamond Particles on Silicon Tips" by E. L. Givargizov et al. in *Applied Surface Science*, 87/88 (1995) 24–30, it was concluded that polycrystalline diamond coated silicon whiskers demonstrate large emission currents. In addition, Givargizov, in an article entitled "Silicon Tips With Diamond Particles on them: New Field Emitters?" *Journal of Vacuum Science and Technology*, 13 Mar./Apr., 1995, stated that silicon tips with high aspect ratios on which diamond particles were deposited by a hot filament process demonstrated operability as a field emission cathode. More particularly, the emitters were prepared on the butt-ends of silicon rods, having conical plateau ends about 200 microns in diameter where silicon whiskers were grown, sharpened, and diamond particles deposited on their ends. From each of the samples, all tips were removed except one having a spherical diamond particle on the very end about one micron in diameter.

In an article by Hong et al. entitled "Field Emission from p-type Polycrystalline Diamond Films", *Journal of Vacuum Science and Technology*, 13 Mar./Apr., 1995, it is disclosed that diamond film deposited by chemical vapor deposition (CVD) on field emitter substrates yielded field emissions at electric field intensity less than 20 MV/m. In this disclosure, a hot-filament CVD (HFCVD) system was employed to fabricate the polycrystalline diamond emitter structures. Particularly, a filament temperature of 2300° C. in an atmosphere of 1% $CH_4$ in $H_2$ 50 Torr was used to achieve a diamond deposition rate of approximately 0.25 $\mu$m hr. and a final film thickness of 2 $\mu$m. In addition, a container of pure boron powder was placed in the substrate holder for in situ doping of diamond film.

Similarly, Liu, et al. in an article entitled "Field Emission Characteristics of Diamond Coated Silicon Field Emitters", *Journal of Vacuum Science and Technology*, 13 Mar./Apr. 1995, demonstrated that single crystal silicon field emitters modified to include a surface deposition of diamond from bias-enhanced microwave plasma chemical vapor deposition exhibited significant enhancement both in total emission current and stability compared to pure silicon emitters. Moreover the effective work function of the polycrystalline diamond coated emitter surfaces was found to be larger than that of a pure silicon emitter surface.

However, none of the above-described procedures are able to achieve reproducible uniform growth of diamond crystallites on all emitter cones of a Spindt-type emission array.

SUMMARY OF THE INVENTION

Accordingly, it is primary object of this invention to provide a new and improved process for the deposition of diamond film on a micro-electronic device.

It is an advantage of the present invention to provide a new and improved process for the deposition of diamond film onto a field emission cathode. It is a particular advantage of the present invention to provide a new and improved process for the deposition of a diamond film onto the emission tips of a Spindt-type cathode.

Additional objects and advantages of the invention will be set forth in part in the description which follows and in part will be obvious from the description, or maybe learned by the practice of the invention. The objects and advantages of the invention may be realized and attained by means of the instrumentalities and combinations particularly pointed out in the appended claims.

To achieve the foregoing objects and in accordance with the purpose of the invention as embodied and broadly described herein, the process of this invention comprises providing a cathode having a substrate, a gate layer, and a plurality of emitters which are electrically insulated from the gate layer. An electric bias is applied to the gate layer and a ground potential to the emitters, a heat source is positioned adjacent the emitters and expose the cathode to a field of positive hydrogen ions for a sufficient period of time to at least partially clean the emitter tips. An alkane gas is added to the atmosphere adjacent to the cathode such that carbon ions are disassociated from the gas and i) deposited on the emitters while the emitters are maintained a temperature below which diamond will form and ii) the temperature of the emitters is increased to a level which allows a diamond film to form.

In a preferred form of the invention, the emitters are comprised of molybdenum or silicon and the gate layer is comprised of molybdenum, silicon, tungsten, tantalum, titanium, nickel, gold, platinum or copper. The process is preferably performed with hydrogen as the ion source and methane as the alkane gas.

In a further preferred embodiment of the invention, the heat source is a filament comprised of tungsten. In a particularly preferred form of the invention, the substrate is a Spindt-type cathode having a molybdenum emitter, molybdenum gate layer, silica insulation layer and silicon base. In a further preferred form of the invention, the diamond film is doped with boron or another material such as nitrogen, phosphorus or lithium.

BRIEF DESCRIPTION OF THE DRAWINGS

The invention consists in the novel parts, construction, arrangements, and improvement shown and described. The accompanying drawings, which are incorporated in and constitute a part of the specification illustrate one embodiment of the invention and, together with a description, serve to explain the principles of the invention.

DETAILED DESCRIPTION OF THE INVENTION

Reference will now be made in detail to the present preferred embodiment of the invention, an example of which is illustrated in the accompanying drawings. While the inventive process will be described in connection with the preferred embodiment or procedure, it will be understood that it is not intended to limit the invention to that procedure. On the contrary, it is intended to cover all alternatives, modifications, and equivalents that may be included within the spirit and scope of the invention defined by the appended claims.

The process used to grow randomly oriented diamond thin films by hot filament chemical vapor deposition (HFCVD) will be presented here with specific emphasis on the inventive modifications, used in the present cathode construction, however, many generalities of the process are known as exemplified in W. A. Yarbrough and R. Messier, Science 247,688 (1990); S. Matsumoto, Y. Sato, M. Kamo, and N. Setaka, Jpn. J. Apl. Phys. 21, L183 (1982); M. Kamo, Y. Sato, S. Matsumoto, J. Cryst. Growth 62, 642 (1983); and S. Mirzakuchaki, et. al., Appl. Phys. Lett. 67 (24) December (1995), herein incorporated by reference.

Historically, a common technique has been performed to mechanically polish the surface using a diamond paste/alcohol mixture, followed by an ultrasonic cleaning in a dilute diamond paste/alcohol solution. The excess diamond paste is removed by rinsing in alcohol or water. This process leaves microscopic diamond particles on the substrate surface which will act as nucleation sites from which the diamond growth process will begin. The film growth rate from this technique is ~1$\mu$ per hour.

Figure 1:
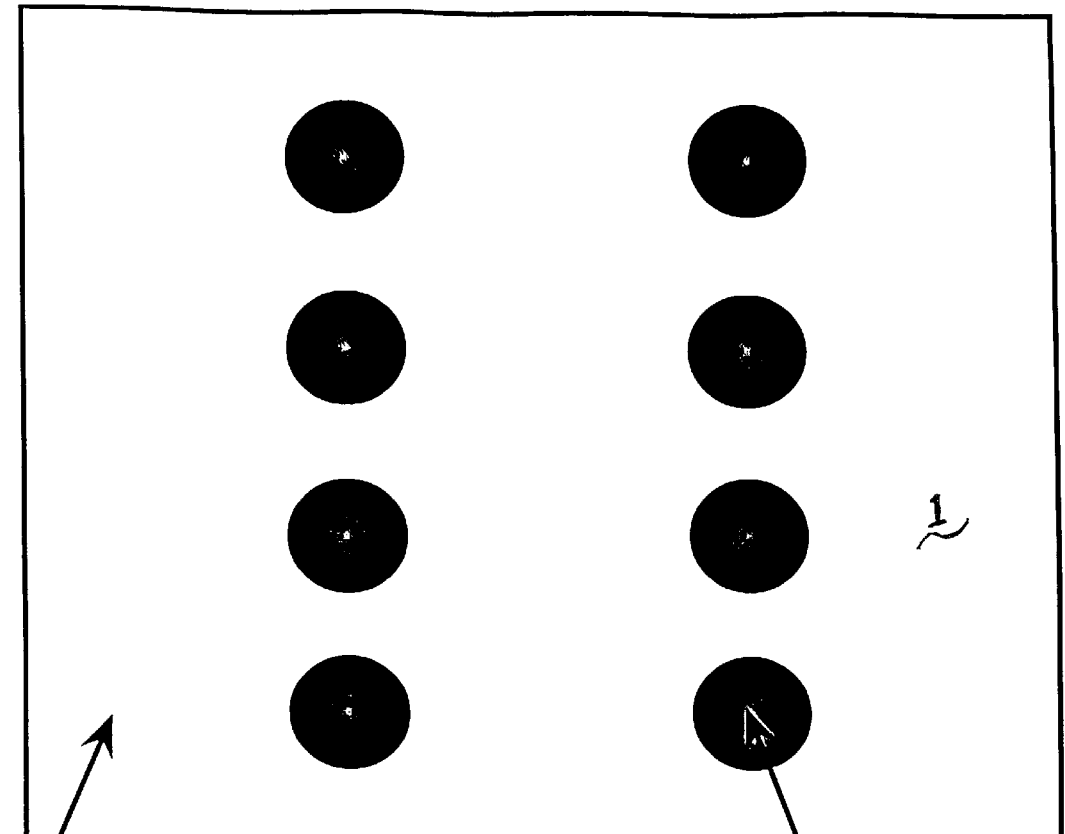
FIG. 1 is a side view of the Spindt-type cold cathode including a diamond film as deposited by the present inventive process.
Figure 1:
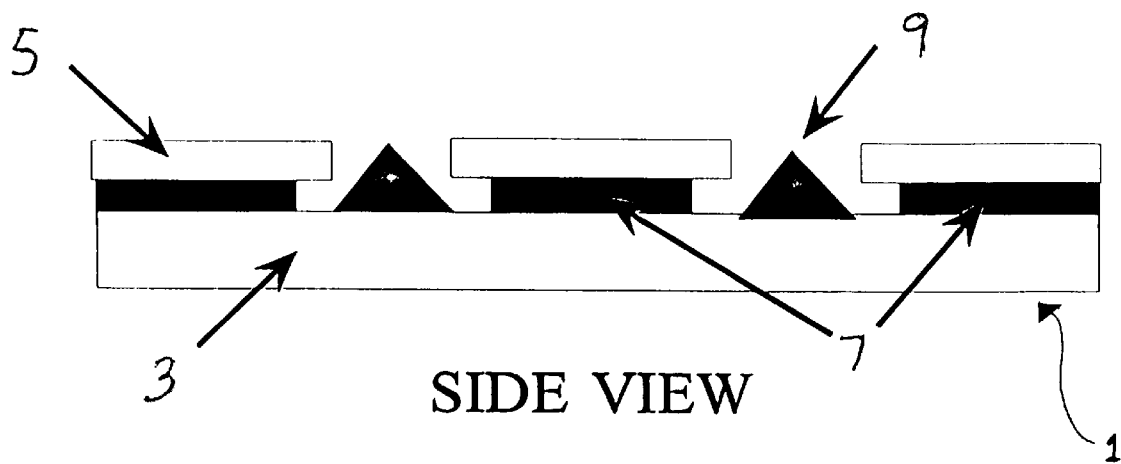

The cathode for use in the present inventive process can be of any type wherein a diamond film is being coated on a material which readily forms carbide layers, such as molybdenum, silicon, tungsten, titanium, tantalum, nickel and copper. The preferred cathode array will include a plurality of emitter tips of one of these materials surrounded by a gate layer of an electrically conductive material—an insulating layer being disposed between the emitters and gate layer. For example, with reference to FIG. 1, a cathode emitter 1, including a gate layer 5 of molybdenum and a substrate layer 3 of silicon is depicted. A plurality of molybdenum emitter tips 9 are dispersed on the substrate layer 3, and thereby insulated from the gate layer 5 by a layer of silicon dioxide 7.

Figure 2:
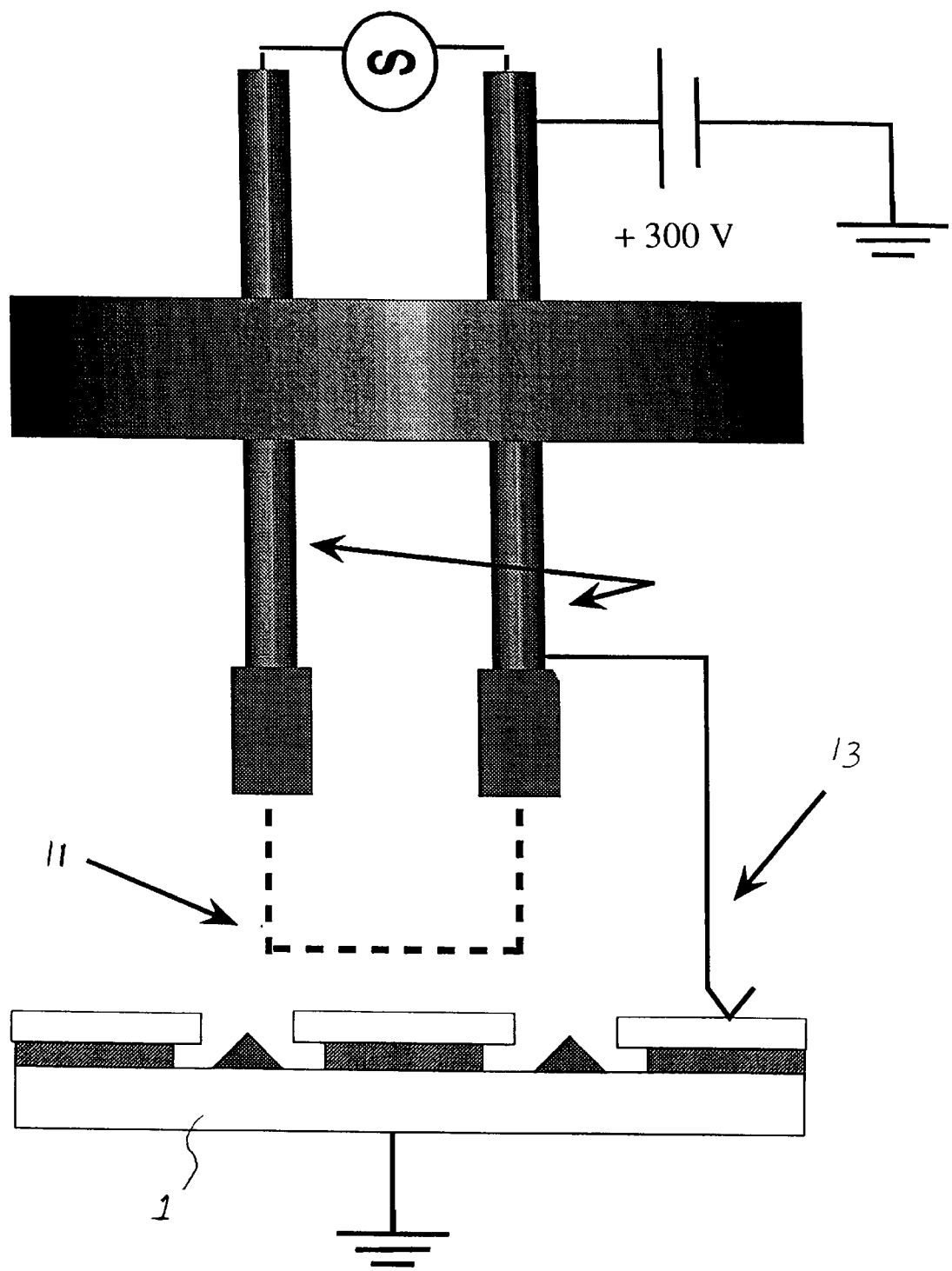
FIG. 2 is a schematic representation of the apparatus used in performing the inventive process.

Referring now to FIG. 2, the cathode emitter 1 is positioned in a vacuum chamber (not shown). In the present process, it is preferred that oxide removal from the surfaces is achieved by exposing the substrate to a hydrogen DC plasma created by heating the filament and a hydrogen gas is added for some predetermined time interval, e.g. 30 min.

A hot filament 11 and gate layer 5 of the cathode are biased positively, e.g. +300 V, using a DC power supply. The voltage is applied to the gate layer via a tungsten probe 13 connected to the electrodes 15 forming part of the filament assembly which is allowed to make contact with the gate surface. The substrate layer 3 of the emitter, and the emitter tips 9, are held at ground potential and electrically isolated from the gate due to the $SiO_2$ layer 7. When the vacuum deposition system is backfilled with the $H_2$ a stream of hydrogen ions are created in the region separating the tips and the gate layer. The ions are repelled from the gate and directed toward the tips. This results in hydrogen cleaning of the emitter tips.

Carbon seeding of the surface is then achieved by creating a carbon rich DC plasma with the substrate temperature lower than necessary for diamond growth, e.g. 500° C. The substrate temperature is controlled by controlling the electric current passing through the tungsten filament. In addition, a separate substrate heater may be used. This allows for the formation of carbon "soot" on the substrate which serves as a nucleation site for diamond when the deposition parameters are later optimized for diamond growth. C+ ions are dissociated from the methane in the presence of applied voltage on the gate layer, and accelerated toward the Mo tips. This results in carbon seeding of the Mo tips only. The seeding process lasts ~15 minutes after which the voltage bias is removed and the deposition parameters are optimized for diamond growth according to conditions as known in the art. Particularly preferred process parameters include:

a) a filament current of 15 A passed through a 6–11 inch long 10–20 mil. diameter tungsten filament, b) a $H_2$ flow rate of 15 g $\mu$m, a $CH_4$ flow rate of 1 g $\mu$m for 15 min. at a pressure of 13–14 Torr; and c) a gate bias maintained at about +250V.

Preferably, $CH_4$ is added to the plasma process with no change to any of the existing process parameters. For diamond growth, carbon is obtained by continuously flowing a 1–2% methane ($CH_4$) in hydrogen ($H_2$) mixture over a W filament held at ~2000° C. The hot filament serves to both dissociate the $CH_4$ and $H_2$ into free carbon and atomic hydrogen, and to keep the substrate at ~850° C. The combination of the substrate temperature and the impinging atomic hydrogen stabilizes the C atoms into a diamond crystal structure usually after a carbide layer is formed.

It is believed that the process is feasible over broad ranges such as:

a) filament current 10–50 A b) $H_2$ flow rate 10–50 g $\mu$m c) $CH_4$ flow rate 0.03–2.0 g $\mu$m d) pressure 10–50 Torr; and e) time 30 min–5 hrs.

Since diamond grows more rapidly on rough or sharp surfaces, the addition of carbon seeding on the Mo tips allows diamond to grow rapidly in these areas. However, since diamond will eventually grown on the Mo gate as well if the deposition time is sufficiently long, the deposition time interval is adjusted to allow crystalline growth on the Mo tips only, and the deposition is terminated before nucleation begins on the gate surface. The deposition time for uniform coverage of the tips is preferably less than ~3 hours.

The process described above produces the diamond crystallites/film in uniform coverage of the field emitter tips with no diamond growth on the gate layer. Based on field emission measurements made from "flat" diamond thin films grown on Mo and Si substrates, these diamond coated Spindt-type arrays show a significant increase in electron emission at the same applied field as compared to conventional Spindt-type arrays.

Thus it is apparent that there has been provided, in accordance with the invention, a method of depositing diamond on a Spindt-type cathode that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A process for depositing diamond film onto a field emission cathode comprising providing a cathode having a substrate, a gate layer and a plurality of emitters electrically insulated from said gate layer, imparting an electric bias on said gate layer, positioning a heat source adjacent said cathode, exposing said cathode to a field of positive ions for a sufficient period to at least partially clean said emitters, adding an alkane gas to said atmosphere adjacent said cathode and maintaining said substrate at a first elevated temperature which is below that required for formation of diamond film but such that carbon ions are dissociated from said alkane gas and form a soot on said emitters, and elevating said substrate layer to a second elevated temperature at which diamond film will form.

2. The process of claim 1 wherein said emitters are comprised of molybdenum, silicon, tantalum, tungsten, copper, beryllium, or alloys thereof.

3. The process of claim 1 wherein said gate layer is comprised of a material selected from the group consisting of molybdenum, silicon, tungsten, titanium, nickel, copper and mixtures thereof.

4. The process of claim 1 wherein said positive ions are derived from hydrogen gas.

5. The process of claim 1 wherein said alkane gas is methane.

6. The process of claim 1 wherein said heat source is a filament.

7. The process of claim 1 wherein said insulating layer is an oxide or nitride of silicon or aluminum.

8. The process of claim 1 wherein said emitter is comprised of molybdenum or silicon.

9. The process of claim 1 wherein said gate layer is comprised of molybdenum, silicon, tantalum or tungsten, titanium, nickel, gold, platinum or copper.

10. The process of claim 1 wherein said substrate is comprised of silicon.

11. The process of claim 1 wherein said cathode is a Spindt-type.

12. The process of claim 1 wherein boron nitrogen, phosphorous or lithium is provided in combination with said alkane gas to achieve doping of said subsequently formed diamond film.

13. The process of claim 1 wherein said substrate temperature is about 500 to 1000° C.

14. The process of claim 1 wherein said diamond film is deposited for between 2 and 6 hours.

15. The process of claim 1 wherein said first elevated temperature is between about 300° C. and 750° C.

16. The process of claim 1 wherein said second elevated temperature is greater than about 800° C.

* * * * *